METHOD OF FORMING A GLASS FILM ON AN OBJECT AND THE PRODUCT PRODUCED THEREBY

Original Filed Sept. 29, 1961

INVENTORS
WILLIAM A. PLISKIN
ERNEST E. CONRAD

United States Patent Office 3,505,106

Patented Apr. 7, 1970

3,505,106

METHOD OF FORMING A GLASS FILM ON AN OBJECT AND THE PRODUCT PRODUCED THEREBY

William A. Pliskin and Ernest E. Conrad, Poughkeepsie, N.Y., assignors to International Business Machines Corporation, New York, N.Y., a corporation of New York Original application Sept. 29, 1961, Ser. No. 141,668. Divided and this application Sept. 22, 1965, Ser. No. 507,977

Int. Cl. H01b 3/08

U.S. Cl. 117—201 4 Claims

ABSTRACT OF THE DISCLOSURE

A semiconductor structure having a thin glass coating, from a fraction of a micron to several microns in thickness, with a softening point of from 440° to 950° C. covering the surface of a semiconductor substrate.

Figure 1:
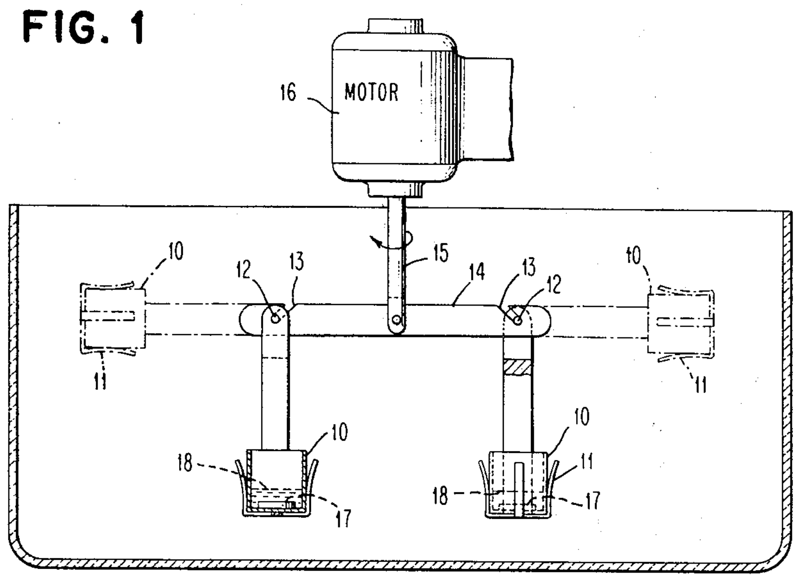

This application is a division of application Ser. No. 141,668 filed on Sept. 29, 1961.

The present invention is directed to the method of forming a glass film on an object and the product produced thereby. More particularly, the invention relates to the method of producing on a surface of an object a hole-free glass film which has a very uniform thickness that may be in the range of about 0.8 to 10 microns.

In the manufacture of various electrical components such as resistors, capacitors and semiconductor devices, it is often desirable to provide them with a tightly adherent protective jacket which serves as a hermetic seal that prevents the contamination of the components by noxious materials which may impair the electrical characteristics of the device or may physically damage them so as to render them unsatisfactory or worthless. A wide variety of coating materials such as plastic and glass have been employed with some success. In general, thick protective jackets of these materials have been used and have proved to be satisfactory for some applications. However, the present trend in the electronic and computer fields is toward the miniaturization of semiconductor or solid-state components. Thick protective coatings undesirably increase the bulk of such components and often such jackets are subject to cracking during required operation over a range of operating temperatures. Attempts to produce thin uniform hole-free adherent films on such components have not met with significant success.

It is an object of the invention, therefore, to produce a new and improved method of applying to an object a hole-free glass film that has a uniform thickness.

It is another object of the invention to provide a new and improved method of forming on an object a hole-free glass film which may have a very uniform thickness in the range of a fraction of a micron to several microns.

It is a further object of the invention to provide a new and improved method of forming on an object an adherent hole-free glass film having a thermal coefficient of linear expansion which does not necessarily substantially match that of the object.

It is an additional object of the invention to provide a new and improved object which has intimately attached to a surface thereof a hole-free glass film that has a very uniform thickness in the range of 0.8 to 10 microns.

In accordance with a particular form of the invention, the method of forming a glass film on a surface of an object comprises centrifuging that object in a fluid having a dielectric constant in the range of 3.4 to 20.7 and containing a suspension of finely divided glass particles, removing the body from the fluid, and heating the body above the softening temperature of the glass particles for a time sufficient to fuse the particles and produce a thin uniform hole-free adherent glass film on the aforesaid surface.

Also in accordance with the invention, there is provided an object which includes a thin hole-free film of glass that is adherent to a surface thereof and has a softening temperature in the range of 440 to 950° C. and a uniform thickness in the range of 0.8 to 10 microns.

The foregoing and other objects, features and advantages of the invention will be apparent from the following more particular description of the preferred embodiments of the invention, as illustrated in the accompanying drawing.

Figure 2A:
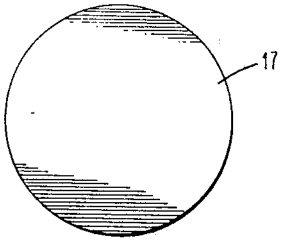
Figure 2B:
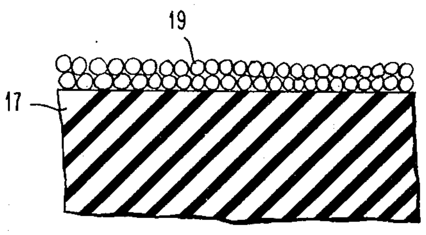
Figure 2C:
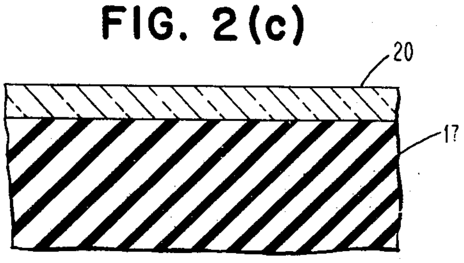

In the drawing:

FIG. 1 is a diagrammatic representation of a centrifuging apparatus employed in forming a glass film on a surface of an object; and FIGS. 2(*a*), 2(*b*), and 2(*c*) are plan and sectional views representing steps in the method of forming a glass film on the surface of an object.

In practicing the present invention, a suitable glass is comminuted as by ball milling to form a powdered glass. Many different types of glasses are suitable for use in accordance with the method of the present invention. The type of glass selected may depend upon the particular application at hand. For example, the object to receive a thin hole-free glass film of uniform thickness may require a chemical resistant glass such as a borosilicate-type glass for protective purposes and for withstanding high operating temperatures. Also, the object may be a device such as a transistor which will operate over a wide range of temperatures which may dictate that, for protective purposes, the coefficient of thermal expansion of the semiconductor material of the device and that of the glass film be substantially equal so as to minimize stresses which might otherwise crack the glass during temperature cycling. For example, silicon has a coefficient of expansion per degree centigrade of $32\times10^{-7}$ which is closely matched by that of a borosilicate glass available to the trade as Corning 7740 or Pyrex and having a coefficient of expansion of $32.6\times10^{-7}$. The ball-milling operation produces small particles of glass of varying size. The powdered glass from the ball-milling procedure is then introduced and dispersed into a suitable fluid suspending medium. An organic fluid such as methyl alcohol is one of many which are satisfactory for this purpose. Other appropriate fluids are ethyl alcohol, isopropyl alcohol, acetone and water. Ultrasonic agitation is particularly useful in dispersing particles in the suspending medium.

Next it is now desirable to remove the larger glass particles from the suspension since they are ordinarily too large for use in subsequent filming operations. This may be accomplished with a centrifuging apparatus such as that represented diagrammatically in FIG. 1. To that end, the suspension of glass particles is placed in two containers 10, 10 which are mounted in carriers 11, 11 that are supported by trunnions 12, 12 in slots 13, 13 in a transverse member 14 that is mounted in a horizontal plane at the end of a drive shaft 15 of a variable speed motor 16. Rotation of the motor for a few minutes at a relatively low speed develops a centrifugal force of from about 15 to 100 times the force of gravity *g* which swings the carriers 11, 11 and their containers 10, 10 to the broken-line positions represented in FIG. 1 and separates out the larger glass particles in the suspension by depositing them on the bottoms of the containers. When the machine comes to rest, the containers 10, 10 may be removed and the suspension decanted leaving behind the undesirable larger particles. The suspension is then placed in other containers and again centrifuged at a higher speed to develop say 500 *g* to separate out the desired finely divided glass particles. It will be appreciated that these speeds of rotation may be varied from that indicated depending upon the particle size separations which are desired. The last-mentioned suspending fluid is decanted leaving the desired finely divided glass particles. The suspension which had been decanted in this last step contains extra fine glass particles which are not always desirable in subsequent operations and may contain unwanted impurities that were picked up in the ball-milling operation.

The desired glass particles are removed from their containers and may be dried on a hot plate to which mild heat is applied or they may be dried in a desiccator at room temperature. Then a suspension is made by ultrasonically mixing the dried glass particles in a fluid suspending medium. 0.02 to 0.1 gram of the glass particles in 100 cc. of the suspending medium has proved to be a useful concentration although other concentrations may be employed. The glass particles are probably irregular in shape and may have a selected mean particle size in the range of 0.1 to 2 microns. Better results may be obtained by using the smaller particle sizes. A selected mean particle size in the range of 0.1 to 0.7 micron has been employed with particular success in forming glass films having uniform thicknesses in the range of 0.8 to 10 microns on substrates of semiconductor and insulating material.

The suspending medium is an organic fluid having a dielectric constant in the range of 3.4 to 20.7. Various suspending media which have proved satisfactory are methyl acetate, ethyl acetate, isoamyl acetate, tertiary butyl alcohol mixed with a slight amount of secondary butyl alcohol to maintain the former fluid at room temperature, isopropyl alcohol, acetone and methyl ethyl ketone. Various mixtures of the recited fluids and also mixtures of those fluids with one or more of the fluids benzene, hexane, petroleum ether and methyl alcohol may be employed. Also mixtures of methyl alcohol and either benzene, hexane, and/or petroleum ether have also proved satisfactory. A few examples of appropriate such mixtures are 73 cc. of normal hexane and 27 cc. of acetone producing a dielectric constant of about 7. 69 cc. of normal hexane and 31 cc. of isopropyl alcohol producing a dielectric constant of 7 have also given good results. A mixture of 9 cc. of isopropyl alcohol and 91 cc. of isoamyl acetate producing a dielectric constant of 6 has been satisfactory. 5–15 parts of isopropyl alcohol to 95–85 parts of ethyl acetate have provided excellent results. A four-component mixture of 10 cc. of isopropyl alcohol, 3 cc. of secondary butyl alcohol, 64 cc. of tertiary butyl alcohol, and 23 cc. of benzene have afforded a dielectric constant of 10 and good results. Best results in the terms of the most uniform glass films have been obtained using suspending media having dielectric constants in the range of 6 to 12. However, when other values of dielectric constants are employed, multiple coats of the glass film have proved effective to avoid pin-hole difficulties. Excellent results have also been obtained when the suspending medium for the glass particles, having a mean particle size of about 0.1 to 0.7 micron, consists of ten parts of isopropyl alcohol to 90 parts of ethyl acetate. The dielectric constant of that fluid mixture is about 7.2 and its viscosity is about 0.6 centipoise. Materials such as isopropyl alcohol and acetone have higher dielectric constants than fluids such as the organic esters, ethyl acetate and amyl acetate of a pure hydrocarbon such as n-hexane. The use of a high dielectric constant fluid which is miscible in a low dielectric constant fluid as the suspending medium for the glass particles is advantageous. The dry glass particles are first ultrasonically mixed with the higher dielectric constant fluid. Any agglomerates which are already present in the dry particles will have a greater tendency to break up and go into suspension. It is believed that the colloidal particles of glass acquire a high electric charge in the higher dielectric constant medium, repel each other more, and thus tend to form a better colloidal suspension. When the lower dielectric constant fluid is added to the suspension just described, the particles still remain in suspension. When the glass particles are first suspended in isopropyl alcohol as explained above, excellent films are obtained. The alcohol also removes water which may be physically absorbed on the glass particles. Another fluid mixture which has afforded good results is one containing 95% tertiary butyl alcohol and 5% secondary butyl alcohol. The important component in this mixture is the tertiary butyl alcohol, the secondary butyl alcohol being used to keep the former in a liquid state since its freezing point is 26° C.

In the next step, the object or substrate 17 (see FIG. 1) to receive the glass film is placed in a clean container 10 together with a quantity of the colloidal suspension 18 of the desired glass particles sufficient to cover the object. The containers are placed in the centrifuge and a centrifuging operation is conducted at a speed and for a period of time sufficient to deposit a uniform coating of glass particles on the object 17. The centrifuging operation is ordinarily conducted for 1 to 2 minutes at a speed sufficient to develop a centrifugal force of 1000 to 2500 g. The centrifuging time and speed are not critical. Slow speeds ordinarily require a longer time to deposit the glass particles on the object or substrate. Speeds sufficient to develop centrifugal forces of about 1870 and 2500 *g* have proved to be particularly desirable in depositing particles of glass having the average sizes under consideration.

After the centrifuging step, the suspension is decanted and the objects 17, 17 are removed from the containers 10, 10. FIG. 2(*a*) represents an object or wafer 17 of insulating material such as glass or semiconductor material which is to receive on its upper surface a deposit of glass particles. FIG. 2(*b*) represents a sectional view of a wafer 17 with a compact homogeneous deposit 19 of finely divided glass particles deposited thereon by the techniques explained above. The representation of the particles is necessarily diagrammatic and of course not to scale since the average particle size will be some value within a range such as from 0.1 to 2 microns. It will be understood that the wafer 17 may be of any suitable material such as a metal or a ceramic, or it may be an electrical device which is not damaged physically or electrically by heating it to the softening temperature of the glass deposit 19 by a procedure which will be described subsequently.

The phenomenon wherein the compact uniform deposit 19 is established on the object 17 by centrifuging that object in a fluid suspension of finely divided particles is a complex one which is not fully understood. However, it has been established that the dielectric constant of the suspending fluid is an important consideration and influences the settling properties of the finely divided glass particles in the suspension. It has been found that with a suspending fluid having a low dielectric constant, the colloidal particles tend to form agglomerates in those fluids and that those agglomerates settle out more rapidly. When the object or substrate is removed from the suspending fluid and examined under a high power microscope after the glass particles have been deposited on the substrate by centrifuging, an uneven deposit is seen wherein the agglomerates appear as mountains. On the other hand, the use of a suspending fluid with a higher dielectric constant establishes a lesser attraction between the glass particles in the suspension and a consequent reduced tendency of the particles to agglomerate. When these particles are settled on the substrate by centrifuging, a smooth even deposit of glass powder is formed. Assume now that the substrate with the deposit thereon is being removed from the suspension. Although a smooth deposit of glass particles exists on the surface of the substrate, unfortunately there is no strong attraction between those particles. Thus, when the substrate is removed from the suspension or the latter removed from the substrate by decanting, there is some flowing of the liquid over the surface of the glass deposit and some of the particles undesirably tend to flow with the liquid, especially if the latter is somewhat viscous. This action is termed "running" and produces an uneven coating of glass particles. Accordingly, it will be appreciated that for the smoothest deposit of glass on the substrate, it is desirable to employ a suspending medium which has a dielectric constant that is high enough to prevent a significant amount of agglomeration, yet is low enough so that the relative movement of that liquid and substrate during separation after centrifuging will not result in the "running" of the glass particles on the substrate. Depending upon the selected mean particle sizes, which may lie within the range of 0.1 to 2 microns as previously stated, fluids with dielectric constants within the range of 3.5 to 20.7 have proved to be satisfactory.

When the structure of FIG. 2(*b*) is removed from the suspending fluid after the centrifuging operation, it is air dried to remove any of the fluid remaining on the structure. When volatile fluids such as the organic fluids previously mentioned are employed as the suspending media, their volatility causes any fluid remaining on the structure to evaporate in several seconds. It may be necessary to preheat the structure to drive out less volatile fluids prior to the next diffusing operation, to be described subsequently, in order that bubbles are not created in the resulting fused glass film.

The structure of FIG. 2(*b*) is introduced for a few minutes into an oven which heats the object 17 and the glass particles 19 to a temperature which is above the softening temperature of those particles. This temperature will vary depending upon the type of glass particles which are employed. The heating operation fuses the glass particles into a thin uniform hole-free glass film 20 as represented in FIG. 2(*c*). Firing times of about 5 minutes have proved to be quite satisfactory. Higher firing temperatures will permit the use of shorter firing times for the glassing operation. It will be evident, however, that the firing temperature and time should be such that the body 17 is not damaged, particularly where that body may be an electrical component such as a semiconductor device. Since thick glass films are not employed, the method of the present invention uses lower firing temperatures than what would be required to apply the thick jackets of the prior art. This is an advantage in applying impervious glass films to the electrical components which may be damaged by the higher firing temperatures.

The following tabulation lists some of the several types of glasses which have been successfully bonded to various substrates, together with some of the characteristics of the glasses and an identification of their major constituents.

| Glass | Softening point, ° C. | Approximate minimum application, temp., ° C. | Coef. of exp. per ° C. | Constituents |
|---|---|---|---|---|
| Corning Glasses: | | | | |
| 1826 Aluminosilicate | 585 | 650 | $49\times10^{-7}$ | Major: $SiO_2$,$B_2O_3$. Minor: $Al_2O_3$,PbO. |
| 3320 Hard Sealing Uranium Glass | 780 | 810 | $40\times10^{-7}$ | |
| 7050 Borosilicate-Series Sealing | 703 | 760 | $46\times10^{-7}$ | Major: $SiO_2$,$B_2O_3$. |
| 7052 Borosilicate-Kovar Sealing | 708 | 775 | $46\times10^{-7}$ | Do. |
| 7070 Borosilicate-Low Loss Electrical | 700 | 780 | $32\times10^{-7}$ | Do. |
| 7570 Soldering Glass | 440 | 475 | $84\times10^{-7}$ | Major: PbO,$SiO_2$,$B_2O_3$. |
| 7720 Borosilicate (Tungsten Sealing-Nonex) | 755 | 805 | $37\times10^{-7}$ | Major: $SiO_2$,$B_2O_3$. Minor: PbO. |
| 7740 Borosilicate (Pyrex) | 820 | 845 | $32.6\times10^{-7}$ | Major: $SiO_2$,$B_2O_3$. |
| 9741 Borosilicate | 705 | 785 | $39\times10^{-7}$ | Do. |
| 8870 High Lead Sealing | 580 | 590 | $91\times10^{-7}$ | Major: $SiO_2$,PbO. Minor: $K_2O$. |
| 8871 Capacitor | 527 | 550 | $103\times10^{-7}$ | |
| 2405 Hard Red | 770 | 810 | $43\times10^{-7}$ | |
| Pemco Corp.: | | | | |
| S1117 | 600 | 625 | $64\times10^{-7}$ | Major: $B_2O_3$,$SiO_2$.ZnO,PbO. |
| PIM 38 | | 820 | ---------- | Major: $SiO_2$,$B_2O_3$ 10% ZnO. |

With thin glass films it is possible to have a greater mismatch in expansion coefficient between the substrate and the glass than can be tolerated with thicker films without subjecting the films to harmful cracking. As an example, Pemco 1117 glass has an expansion coefficient of $64\times10^{-7}$ per ° C. whereas a silicon substrate has an expansion coefficient of only $32\times10^{-7}$ per ° C. With the technique of the present invention, films of the glass just mentioned having a thickness as great as 9 microns did not crack upon application to a silicon substrate. Furthermore they did not crack on cycling between a hot plate held at a temperature of 300° C. and immersion in liquid nitrogen at a temperature of −196° C. By way of contrast, glass films 1 mil thick applied to silicon wafers by screening techniques of the prior art were cracked on cooling from the glass melt.

From the foregoing description and explanation, it will be seen that the method of the present invention is a relatively simple one for providing a very thin uniform hole-free glass film on the surface of a substrate. It will also be clear that a device which includes a tough thin glass protective film applied in accordance with the techniques of the present invention may be operated over a substantial range of temperatures without cracking that film. Furthermore, a substrate which includes a glass film bonded thereto in accordance with the process of the invention need not have a coefficient of thermal expansion which closely matches that of the glass. Since the sizes of the glass particles are extremely small and because the glass films applied to substrates in accordance with the techniques of this invention are extremely thin, the temperature required to fuse the films to those substrates may be kept relatively low and this, accordingly, reduces the possibility of injuring an electrical device which may constitute that substrate. It will further be clear that the thin uniform glass films of the present invention find utility in the miniaturization of components where tiny space considerations are extremely important.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor object which includes a thin hole-free film of glass that is adherent to a surface thereof and has a softening temperature in the range of 440–950° C. and a uniform thickness in the range of a fraction of a micron to several microns.

2. A semiconductor object which includes a thin hole-free film of glass that is adherent to a surface thereof and has a softening temperature in the range of 440–950° C. and a uniform thickness in the range of 0.8–10 microns.

3. A silicon object which includes a thin hole-free film of borosilicate glass that is adherent to a surface thereof and has a softening temperature of about 600° C. and a uniform thickness of not more than 9 microns.

4. A semiconductor object which includes a thin hole-free film of borosilicate glass that is adherent to a surface thereof and has a softening temperature in the range of 600–850° C. and a uniform thickness in the range of 0.8–10 microns.

References Cited

UNITED STATES PATENTS

| | | | |
|---|---|---|---|
| 2,804,405 | 8/1957 | Derick et al. | 148—1.5 |
| 3,301,706 | 1/1967 | Flaschen et al. | 117—215 XR |

OTHER REFERENCES

Taylor: "Physical Review," vol. 23, 1924 p. 657.

WILLIAM L. JARVIS, Primary Examiner

U.S. Cl. X.R.

117—101; 317—234, 239